(12) United States Patent
Schiavoni et al.

(10) Patent No.: US 8,174,766 B2
(45) Date of Patent: May 8, 2012

(54) TEXTURED PLATE COMPRISING ASYMMETRICAL PATTERNS

(75) Inventors: Michele Schiavoni, Paris (FR); Patrick Gayout, Villemomble (FR); Nils-Peter Harder, Hameln (DE); Ulf Blieske, Edingen Neckarhausen (DE)

(73) Assignee: Saint-Gobain Glass France, Courbevoie (FR)

( * ) Notice: Subject to any disclaimer, the term of this patent is extended or adjusted under 35 U.S.C. 154(b) by 935 days.

(21) Appl. No.: 11/917,438

(22) PCT Filed: Jun. 13, 2006

(86) PCT No.: PCT/FR2006/050552
§ 371 (c)(1),
(2), (4) Date: May 9, 2008

(87) PCT Pub. No.: WO2007/015019
PCT Pub. Date: Feb. 8, 2007

(65) Prior Publication Data
US 2009/0320899 A1  Dec. 31, 2009

(30) Foreign Application Priority Data

Aug. 2, 2005 (FR) .......................... 05 52416

(51) Int. Cl.
*G02B 27/10* (2006.01)
(52) U.S. Cl. .......................... 359/625; 136/256
(58) Field of Classification Search ................ 359/625, 359/637, 455; 136/255
See application file for complete search history.

(56) References Cited

U.S. PATENT DOCUMENTS

| | | | |
|---|---|---|---|
| 5,080,725 A | * | 1/1992 | Green et al. .................. 136/256 |
| 5,729,387 A | | 3/1998 | Takahashi et al. |
| 5,890,791 A | | 4/1999 | Saito |

FOREIGN PATENT DOCUMENTS

| | | |
|---|---|---|
| BR | 8 502 839 | 1/1987 |
| EP | 1 331 495 | 7/2003 |

OTHER PUBLICATIONS

U.S. Appl. No. 12/600,152, filed Nov. 13, 2009, Schiavoni, et al.
Scheydecker, A., et al., "Reduction of Reflection Losses of PV-Modules by Structured Surfaces", Solar Energy, vol. 53, No. 2, pp. 171 to 176, 1994.

* cited by examiner

*Primary Examiner* — Joseph P Martinez
(74) *Attorney, Agent, or Firm* — Oblon, Spivak, McClelland, Maier & Neustadt, L.L.P.

(57) ABSTRACT

A plate of transparent material including, on its surface, a texture including a plurality of a feature in relief, whether in a form of depressions or projections. The feature includes a first face and a second face that are not mutually parallel, lines at a base of the faces being parallel. The first face forms, with the general plane of the plate, a larger angle than the angle formed by the second face with the general plane of the plate, the angles being angles inside the material if the feature is a projection, or angles on the outside of the material if the feature is a depression. The plate improves light transmission toward a photovoltaic cell, in particular when the plate is in a vertical position, for example on the surface of a noise barrier.

26 Claims, 6 Drawing Sheets

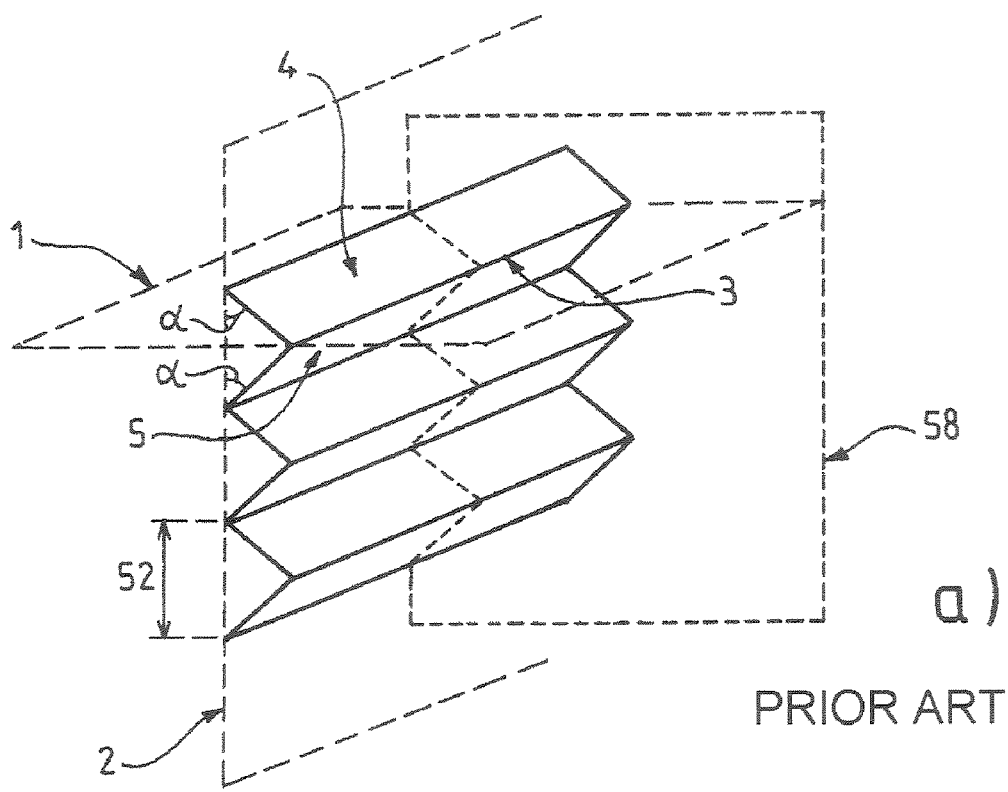
a)
PRIOR ART
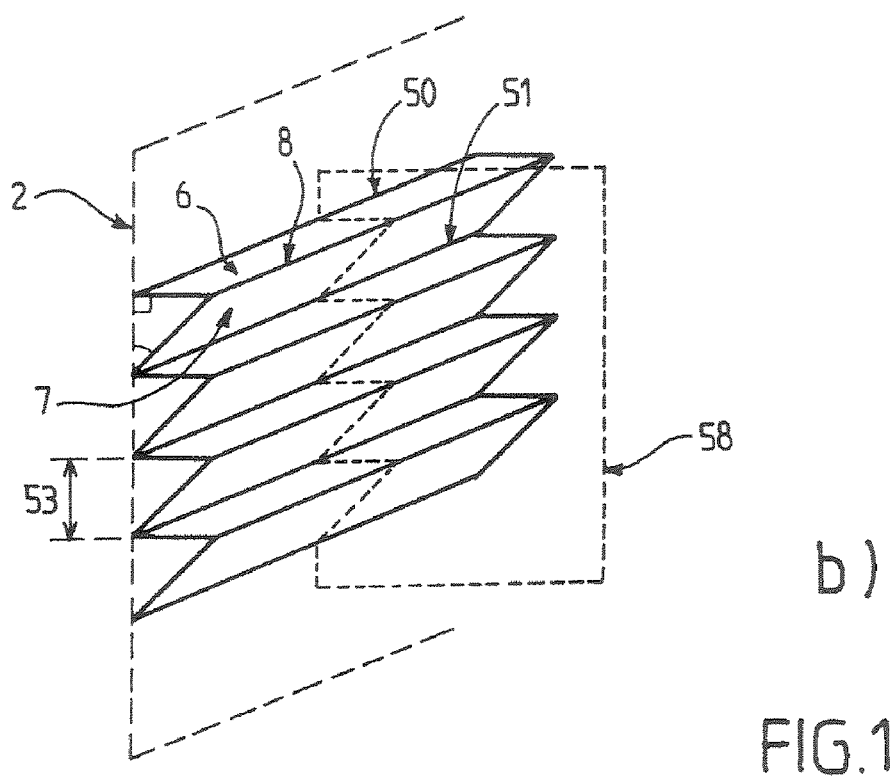
b)
FIG.1

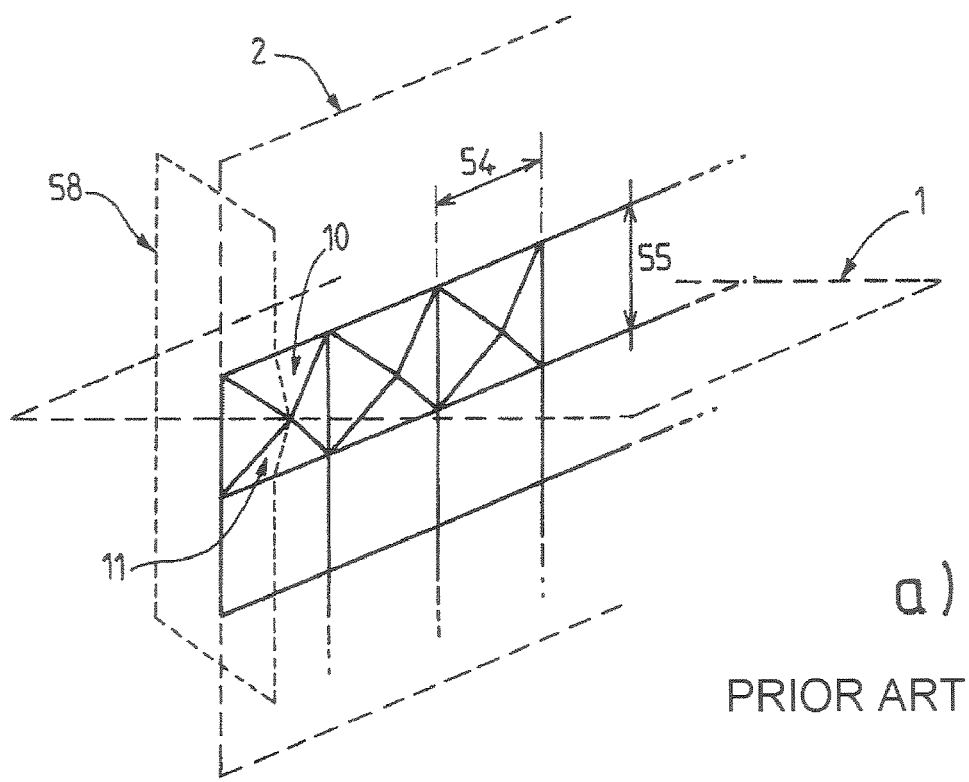
a)
PRIOR ART
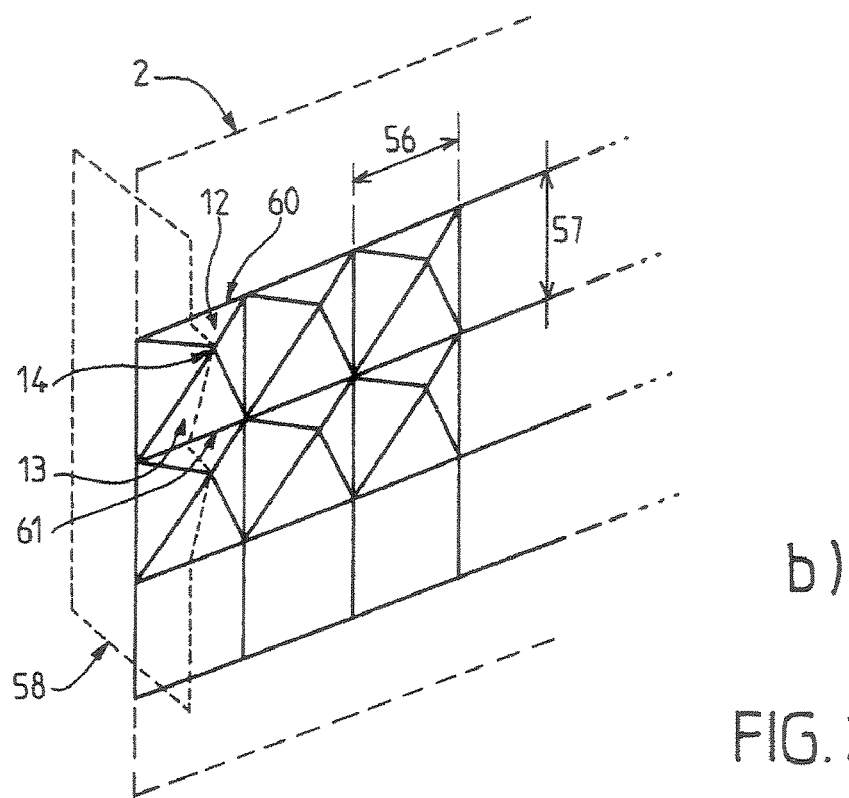
b)
FIG. 2

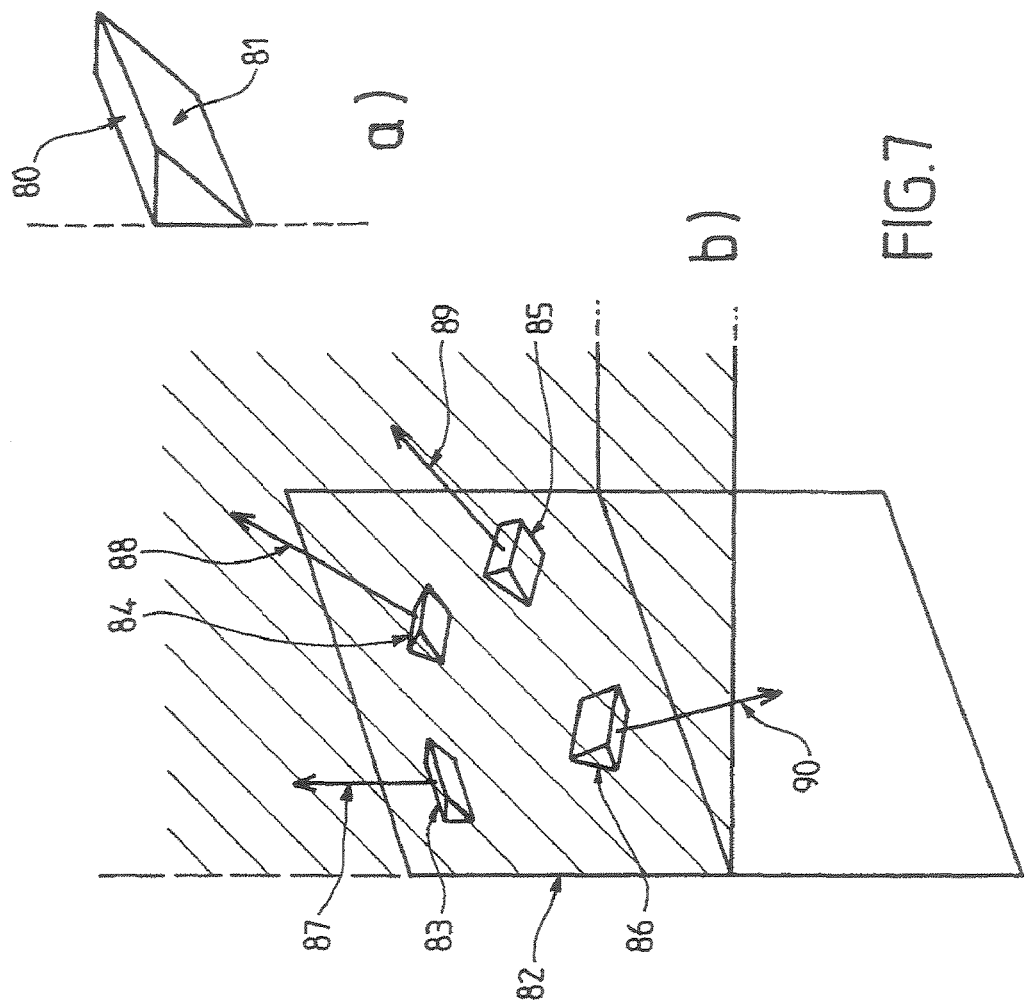
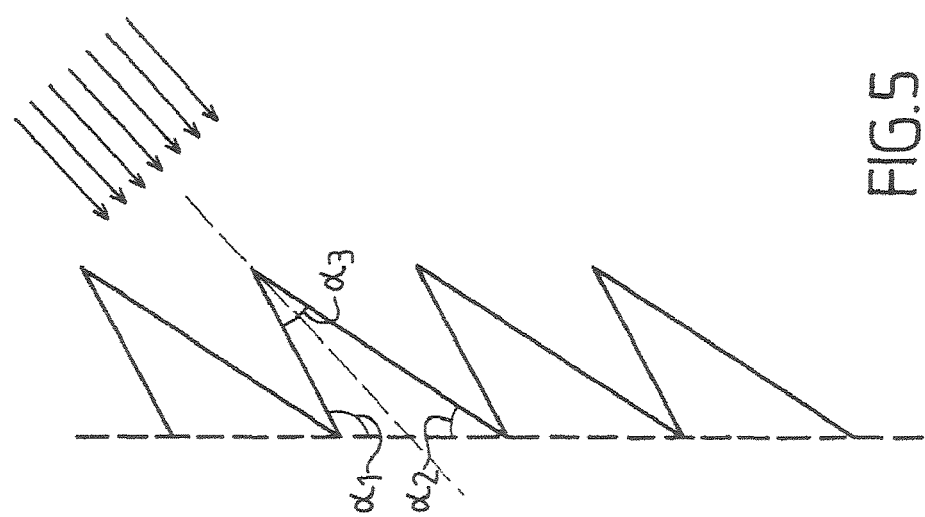

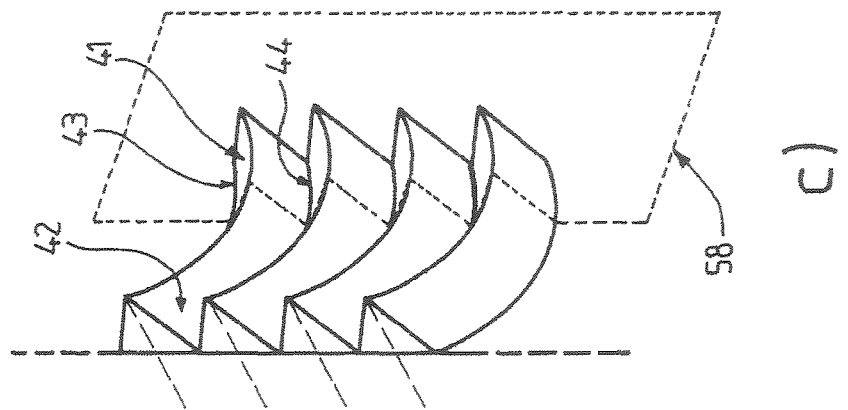
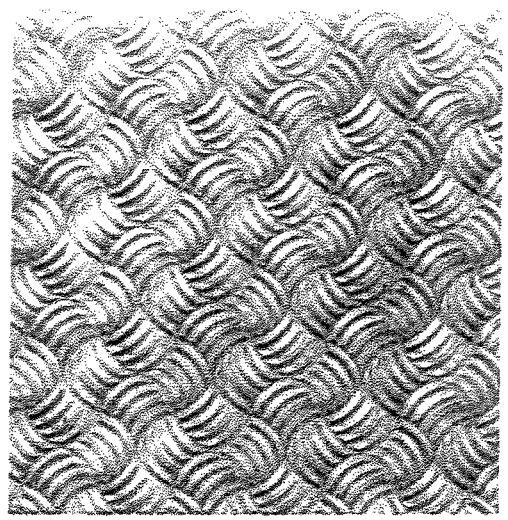
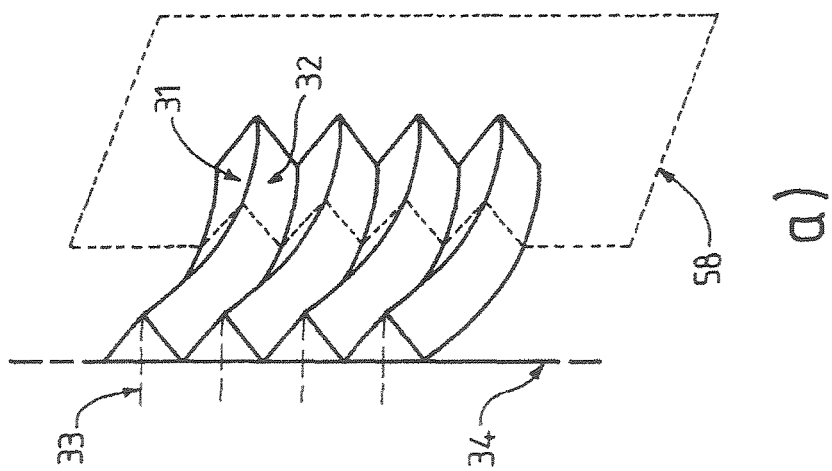
FIG.6

TEXTURED PLATE COMPRISING ASYMMETRICAL PATTERNS

The invention relates to a textured transparent plate, the texture of which improves the light transmission through said plate. In particular, the plate may advantageously be placed between a light source and a photovoltaic cell so as to increase the light intensity transmitted to the cell. More generally, the plate increases the transmission in the direction of an element which is juxtaposed with said plate and has a refractive index greater than that of the material of which the plate is made.

It is known that pyramidal or prismatic textures on the surface of a transparent plate can improve the light transmission of the plate. The reader may refer in particular to the following documents of the prior art: WO 03/046617 and PCT/FR2005/050304. According to the prior art, the features in relief proposed for producing this effect have a symmetrical appearance. This symmetry is manifested by the existence of two mutually orthogonal planes of symmetry at the scale of each feature. Such symmetrical features optimally transmit the light when the plate directly faces the light source, that is to say when the plate is oriented perpendicular to the light source/plate direction. These optimum illumination conditions are in fact rarely encountered in general for various reasons such as the fact that the position of the sun is permanently changing or because the plate must have a given imposed position not necessarily corresponding to the best orientation for receiving the light. For example, if the plate constitutes the external surface of a noise barrier, this plate is generally positioned vertically, as any wall. This position will be better suited when the sun is indeed facing the plate, that is to say in the evening at sunset or in the morning at sunrise, or close to the poles, but on condition that the wall is indeed facing the sun at the correct moment. Lower light yields will be observed in other circumstances.

It has now been found that it could be advantageous for the features to be asymmetrical so as to better capture the light when the incident rays are not exactly perpendicular to the plate, which is in fact the most frequent case. These asymmetrical features also contain a plane of symmetry for the feature, but generally do not contain two mutually orthogonal planes of symmetry. Generally speaking, the plane of symmetry is perpendicular to the general plane of the plate.

The invention firstly relates to a plate of transparent material having, on its surface, a texture comprising a plurality of a feature in relief, whether in the form of depressions or projections, said feature comprising a first face and a second face that are not mutually parallel, the lines at the base of these faces being parallel, said first face forming, with the general plane of the plate, a larger angle than the angle formed by said second face with the general plane of the plate, the angles in question being those inside the material if the feature is a projection, or those on the outside of the material if the feature is a depression. In general, the plate comprises, on its surface, a plurality of said features in order to improve the light transmission through the plate. The "first face" makes a larger angle with the general plane of the plate than the "second face" does. Thanks to this particular geometry, and if the incident light rays do not always strike the plate perpendicularly to it, the plate can collect more light if its orientation is judiciously chosen.

The features may appear as depressions in the plate or, on the contrary, emerge from the plate (that is to say appear as projections or protuberances).

If the feature is a projection, the angles of the faces taken into consideration are those on the inside of the material. If the feature is a depression, the angles of the faces taken into consideration are those on the outside of the material.

If the feature is a depression, the two faces generally join at a point or a line located the most internally in the plate. In this case, the base of the feature is located the most externally with respect to the plate. The intersection of each of the faces (the first face on the one hand, and the second face on the other) with the base of the feature defines a line, the two lines thus defined (one line per face) being parallel. These lines may be straight or curved depending on the feature.

If the feature is a projection, the two faces generally join at a point or a line located the most externally to the plate. In this case, the base of the feature is located the most internally with respect to the plate. The intersection of each of the faces (the first face on the one hand, and the second face on the other) with the base of the feature defines a line, the two lines thus defined (one line per face) being parallel. These lines may be straight or curved depending on the feature.

The two faces are not mutually parallel, but they may each contain an edge or base line of the feature (generally a straight line, but possibly also a curve) parallel with an edge or base line of the feature (generally a straight line, but possibly also a curve) contained in the other face, these two edges or base lines being also parallel to the general plane of the plate. In each plane parallel to the plane of symmetry of the feature, the two faces make an angle between them, the bisector of which will be considered (by dividing said angle into two equal half-angles). Preferably, the plate is oriented as far as possible so that the direction of the incident light rays are parallel to this bisector. In practice, the plate may be left in a fixed position, by orienting it in the best possible average position for collecting the most light, that is to say facing south in the Northern Hemisphere or facing north in the Southern Hemisphere, the general plane of the plate making an optimized angle with the horizontal, said angle depending on the latitude. For example, the angle may be 35° in Paris (France). However, the angle of inclination to the horizontal may be imposed by the function of the plate. The invention makes it possible in particular to have angles of inclination of the plate that are much higher, so that the plate may be even be vertical. If the plate forms an external wall of a noise barrier, this plate is placed in a vertical position. Thus, the invention also relates to a wall comprising a plate according to the invention, especially a vertical wall. The invention also relates to a noise barrier comprising such a wall.

The two faces at the origin of the invention (namely the "first" face and the "second" face) are generally smooth, especially when observed with the naked eye. They may be plane especially if they form part of a prism or a pyramid. However, they may also be curved. A prism comprises two main faces joining (or intersecting) along a line. A pyramid according to the invention preferably comprises four faces, the base of said pyramid forming a square or a rectangle or a rhomb. The pyramid may also have more than four faces, for example six faces.

As first embodiment according to the invention, a plate comprising a plurality of prismatic features on its surface may be described. Such features are shown in FIG. 1b). FIG. 1a) shows the prismatic features of the prior art, which are symmetrical with respect to the plane 1 and with respect to the plane 58, these two planes being mutually perpendicular and perpendicular to the general plane 2 of the plate. The plane 1 passes through the outermost line 3 with respect to the general plane of the plate. This line 3 is at the intersection of the two faces 4 and 5, these two faces making the same angle α with the general plane 2 of the plate. FIG. 1b) is according to the invention, in which each feature, in the form of a projecting prism, comprises two smooth plane faces 6 and 7 which are not mutually parallel and which join along a line 8 located the most external to the plate, the angle that the face 6 makes with the general plane 2 of the plate being greater than the angle that the face 7 makes with the same plane 2. The angles considered are those on the inside of the material of the plate because the feature is a projection. The first face 6 contains a line 50 at the base of the feature (the feature here is an asymmetrical prism), said line being located the most internal to the plate. The second face 7 contains a line 51 at the base of the feature, said line being located the most internal to the plate. The lines 50 and 51 are mutually parallel and parallel to the general plane of the plate. This feature has a plane of symmetry 58 perpendicular to the general plane of the plate 2. This geometry is advantageous if, for example, the plate is in a vertical position and intended to collect the solar energy in order to transmit it to a photoelectric cell placed behind it. The luminous efficiency would however be much less if the plate were to be in a reverse position, that is to say with face 7 on top and face 6 below. The pitch of the features in FIGS. 1a) and 1b) corresponds to the distances 52 (FIG. 1a) and 53 (FIG. 1b).

The invention may also apply to pyramidal features. FIG. 2b) shows such pyramidal features. FIG. 2a) shows the pyramidal features according to the prior art. These pyramids (as projections) have two planes of symmetry 1 and 58, which are mutually orthogonal and perpendicular to the general plane 2 of the plate and passing through the apex of the pyramid which is the outermost point of the feature with respect to the general plane of the plate. The two faces 10 and 11 are identical and make the same angle with the general plane of the plate. FIG. 2b) is according to the invention in which each feature, in the form of a pyramid, comprises two smooth plane faces 12 and 13, which are not mutually parallel and which join at a point 14 (or apex) located, at the feature, the most external to the plate, the angle that the face 12 makes with the general plane 2 of the plate being greater than the angle that the face 13 makes with the same plane 2. Here, the angles taken are on the inside of the material because the features are projections. The first face 12 contains a line 60 at the base of the feature (the feature here is an asymmetrical pyramid), said line being located the most internal to the plate. The second face 13 contains a line 61 at the base of the feature, said line being located the most internal to the plate. The lines 60 and 61 are mutually parallel and parallel to the general plane of the plate. Each feature has a plane of symmetry 58 perpendicular to the general plane of the plate. This geometry is advantageous if, for example the plate is in a vertical position and intended to collect the solar energy for transmitting it to a photoelectric cell placed behind it. The luminous efficiency would, however, be lower if the plate were to be in the reverse position, that is to say with face 13 on top and face 12 underneath. This is because, irrespective of the latitude, the solar rays have a direction closer to the direction of the bisector between the faces 12 and 13 if the face 12 is on top. The features in FIGS. 2a) and 2b) have two pitches, corresponding to the distances 54 and 55 (FIG. 2a) on the one hand and to the distances 56 and 57 on the other (FIG. 1b).

The invention is not limited to the case in which the two faces (the first and second faces) at the origin of the invention are plane, since these faces may be curved. FIG. 6a shows prismatic features, the two plane surfaces 31 and 32 of which are curved. These features have a plane of symmetry 58 and are approximately symmetrical insofar as each bisector 33 contained in a plane parallel to the plane of symmetry 58 is orthogonal to the general plane of the plate 34. This type of feature may be incorporated into a textured surface assembly as shown in FIG. 6b). Features of the type shown in FIG. 6a) are here juxtaposed with different orientations. Thanks to this arrangement, the plate has a uniform appearance in reflection over its entire surface, while still collecting the light in an efficient manner. The textures shown in FIGS. 6a) and 6b) are not according to the present invention as each bisector 33 contained in a plane parallel to the plane of symmetry 58 is orthogonal to the general plane of the plate. The texture shown in FIG. 6c) is according to the invention since one of the faces, namely 41, makes a larger angle with the general plane of the plate than the other face 42. These curved prismatic features have curved baselines 43 and 44. It may be seen that the bisectors here are not orthogonal to the general plane of the plate. These deformed features (i.e. deformed with respect to those of FIG. 6a) may also be incorporated so as to be juxtaposed with different orientations on a plate in a manner similar to that shown in FIG. 6b). As may be seen in FIG. 6b), a feature corresponds to a set of four prisms of FIG. 6a), it being possible for said feature to lie substantially within a square. The pitch of the feature corresponds to one side of said square. If this plate is placed vertically, it is recommended that the faces of the "first face" type 41 be placed preferably in the upper position. In this case, the invention properly provides its effect (light collection) with, in addition, an improved appearance in reflection (uniform appearance to an observer looking at the plate with the naked eye a few meters distant therefrom).

In order for the invention to produce its effect better, it is preferable for the light rays to have a direction approaching the bisectors as close as possible between the two faces according to the invention. For a feature projecting from the plane, this may be represented in section in a plane perpendicular to the general plane of the plate and parallel to the plane of symmetry, as shown in FIG. 3. This representation is equally valid for prismatic features with plane faces (FIG. 1b) as for pyramidal features (FIG. 2b), and also for prismatic features with curved faces (FIG. 6c). In all cases, the feature comprises a face 15 making an angle $\alpha_1$ with the general plane 2 of the plate, and a face 16 making an angle $\alpha_2$ with the general plane 2 of the plate, the angle $\alpha_1$ being greater than the angle $\alpha_2$. Since the feature is a projection, the angles are taken on the inside of the material of the plate ($\alpha_1$ and $\alpha_2$) and not the angles external to the material ($\alpha_4$ and $\alpha_5$). The two faces 15 and 16 make an angle $\alpha_3$ at the apex, the bisector of which is 19. The figure shows two types of light exposure, the case in which the light rays 17 strike the face 16 directly but do not strike the face 15 directly, and the case in which the light rays 18 strike both faces, the direction of the light being parallel to the bisector 19. The invention provides its effect in the case of the rays 18. If the light rays were always to be perpendicular to the general plane of the plate (which does not correspond in fact to any actual situation on earth), a texture with symmetrical features would be suitable. The plate may be placed vertically, for example, on the surface of a noise barrier, photoelectric cells being placed inside said barrier in order to receive the solar energy through the plate, the face making the larger angle with the plate being placed in the up position, so that the incident solar rays preferably strike this face.

The invention also applies with features in the form of depressions, as shown in FIG. 4. This representation is valid both for prismatic depressions and for pyramidal depressions in the plate. This feature comprises a first face 20 making an angle $\alpha_1$ with the general plane of the plate and a second face 21 making an angle $\alpha_2$ with the general plane of the plate, the angle $\alpha_1$ being greater than the angle $\alpha_2$. Here, the angles considered are the angles on the outside of the material ($\alpha_1$ and $\alpha_2$) because the feature is a depression, and not the angles inside the material ($\alpha_4$ and $\alpha_5$). The best luminous efficiency is obtained when the incident light rays 22 are in a direction parallel to the bisector 23. The first face 20 contains a line 70 at the base of the feature (said base being located to the outside relative to the plate) and the face 21 contains a line 71 at the base of the feature, so that the lines 70 and 71 are mutually parallel and parallel to the general plane of the plate, whether the feature is a prism or a pyramid.

The ratio between, on the one hand, the angle (in degrees) between the first face and the plane of the plate and, on the other hand, the angle (in degrees) between the second face and the plane of the plate is greater than 1 and generally greater than 1.1, and may even be greater than 1.2. To give an example, the angle that the face (called the "first face") having the largest angle makes with the plane of the plate may range from 50° to 130° and preferably from 70° to 88°. In practice, it is very difficult to produce an angle greater than 85° using the rolling technique. The angle that the face (called the "second face") having the smallest angle makes with the plane of the plate may range from 10° to 60°, and preferably from 20° to 50°. A preferred texture corresponds to the combination of an angle of 85° for the first face with an angle of 45° for the second face. The features may be of the type of those shown in FIG. 5, with an angle $\alpha_1$ greater than 90° and an angle $\alpha_2$ less than 45°. In practice, it is very difficult to produce such a texture by rolling and it is necessary to produce it by much more sophisticated techniques, such as laser cutting, which is, however, relatively expensive. This is why, in practice, so as to remain within the scope of a texture that can be produced by rolling, it is preferable for the angle $\alpha_1$ (the larger of the angles that the two faces according to the invention make with the general plane of the plate) to be less than 90°.

FIG. 1a is a view of a prior art plate with prismatic features;

FIG. 1b is a view of plate with prismatic feature;

FIG. 2a is view of a prior art plate with pyramidal features;

FIG. 2b is view of a plate with pyramidal features;

FIG. 5 is a view of a plate with a projecting feature;

FIG. 6a, 6b and 6c are views of a plate with curved feature;

FIG. 7a and 7b are views of a plate with asymmetrical prism feature; and

Figure 4:
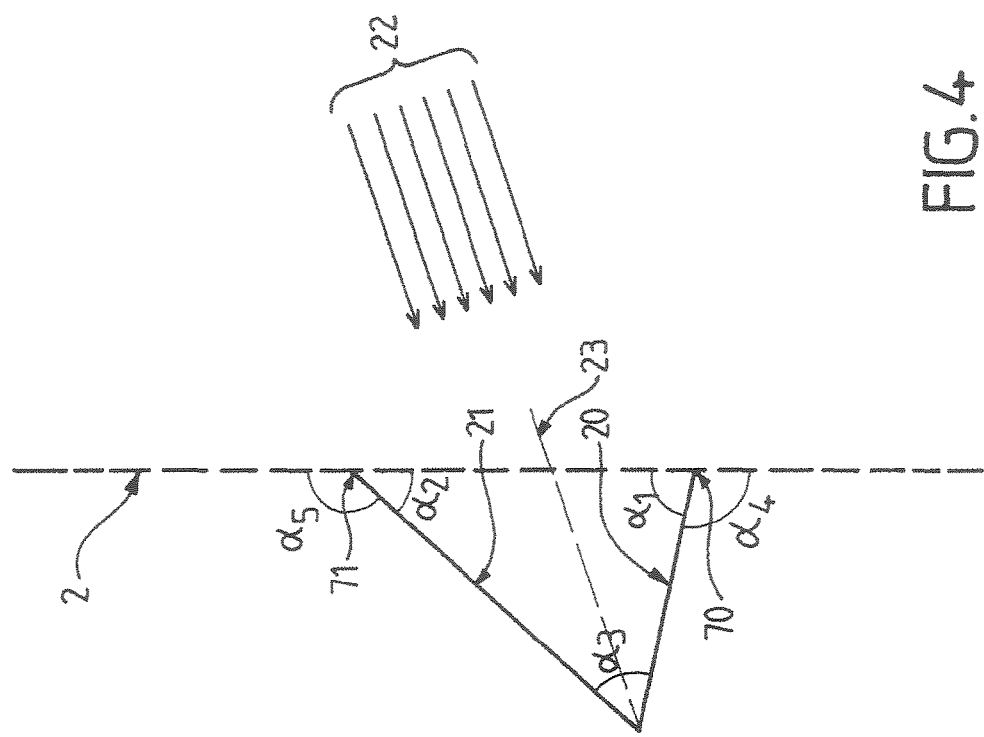
FIG. 4 is veiw of a plate with a depression feture.
Figure 3:
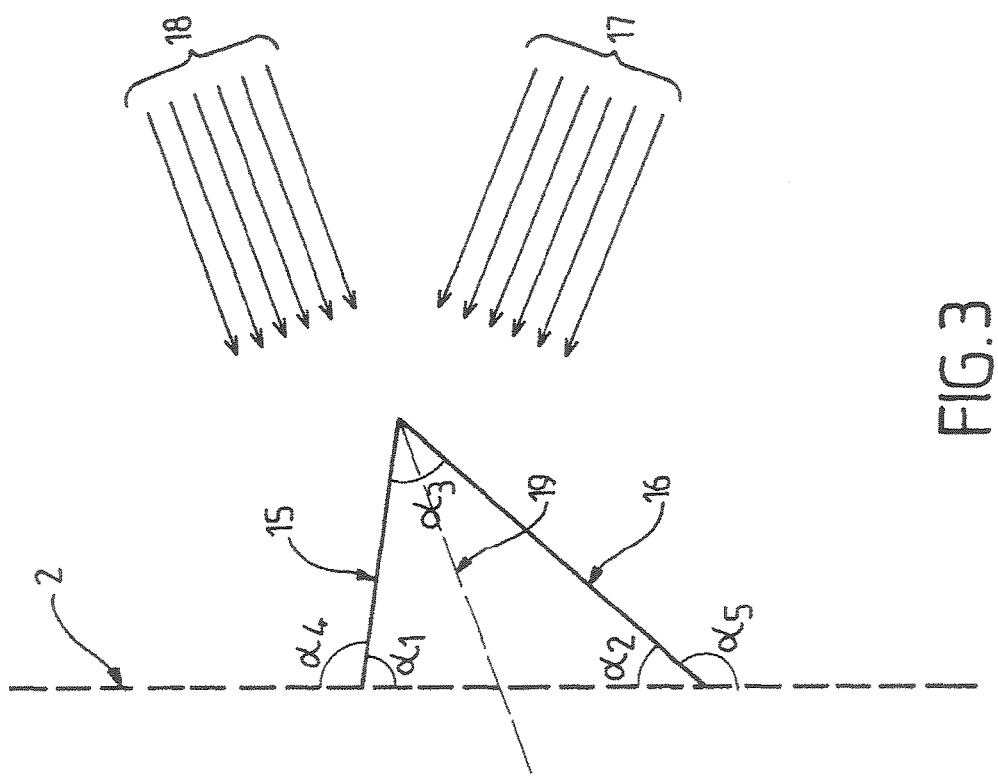
FIG. 3 is view of a plate with a projecting feature.

The rolling technique that can be used to produce the texture according to the invention is explained in particular in application PCT/FR2005/050304. Of course, it is very difficult to produce with this technique faces that are strictly plane and edges that are very sharp, especially because of the very small size of the features, so that it would not be outside the scope of the present invention if the faces or the apexes or the edges of the features were to be slightly rounded.

The plate is made of a transparent material that is as clear as possible, such as a mineral glass, or an organic polymer (PMMA, polycarbonate, etc.).

The effect according to the invention occurs whatever the size of the features. The features may, for example, have one or more pitches each ranging from 0.1 to 10 mm, especially 1 to 6 mm. In the case of a prism, the pitch is the periodicity of the lines parallel to the base of the prisms. In the case of pyramids, it is the length of the base of said pyramids. Preferably, the pyramids have four sides. More generally, the pitch characterizes the distance at which the features are repeated, or the length of the features if they are touching.

It is not excluded to mix, on the surface of the plate according to the invention, a plurality of features of different shape, or with the same features but oriented differently on the plate. The plate provides an effect according to the invention as soon as a single feature according to the invention is present, even if it is mixed with other features that are symmetrical. The invention provides a greater effect if more features according to the invention are present and are compatibly oriented. Features are oriented compatibly if their respective "first faces" are oriented in approximately the same manner. The orientations of these features (with respect to their "first faces") are not necessarily exactly identical, but it is recommended that they not be opposed orientations. Thus, the features according to the invention present on the surface of the plate are preferably predominantly oriented (more than 50% of their total number and preferably more than 70% of their total number) so that all the directions orthogonal to the "first faces" of each feature are contained within the same quarter space facing the plate. The invention also relates to a method of capturing light, comprising the positioning of a plate according to the invention in such a way that the direction of the incident light rays lies within said quarter space.

FIG. 7a) shows a feature of the asymmetrical prism type comprising a "first face" 80 and a "second face" 81. This feature has been placed on the surface of the plate 82 (FIG. 7b) in different orientations. The features 83, 84 and 85 have a compatible orientation since the directions (87, 88, 89) orthogonal to the first faces of these features are all included within the quarter space facing the plate, corresponding to the hatched volume. In contrast, the feature 86 is not compatible with the others, since the direction orthogonal to its first surface departs from the quarter space facing the plate. The features 83, 84 and 85 may advantageously receive the light rays included within the hatched quarter space that arrive in their direction.

Figure 8:
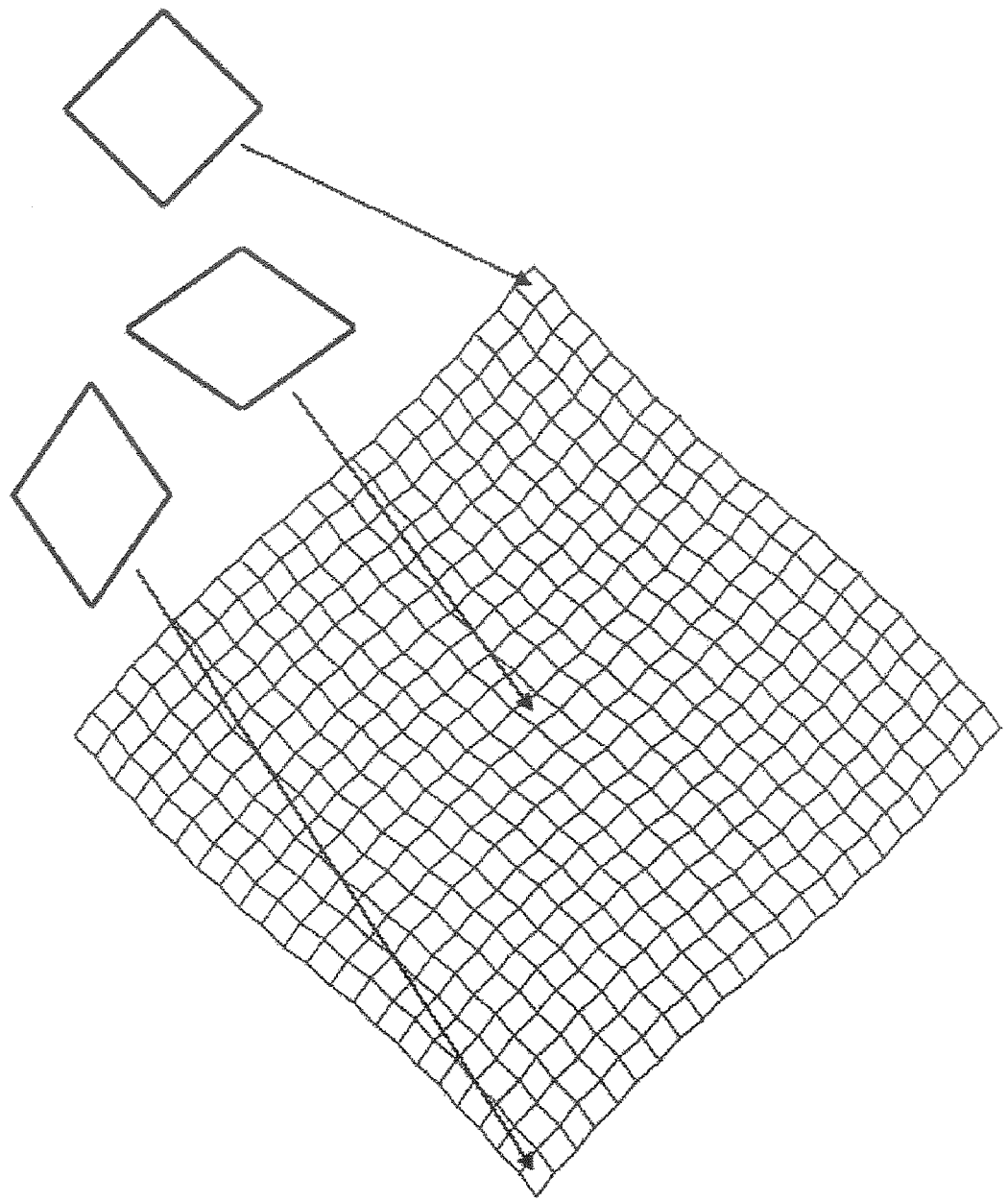
FIG. 8 is view of a plate with pyramid bases.

If all the features present on the surface of the plate are identical, the appearance of the plate may sometimes be unattractive in reflection, as one portion of the plate reflects the incident rays at a certain angle for the observer, whereas another portion of the plate will reflect the incident rays in another way for the observer. This is because the observer is not at an infinite distance from the plate. This problem also exists in the case of the symmetrical features of the prior art. A means of remedying this has been found, it being the subject of German patent applications DE 102005027799.3 and DE 102005027737.3 that were filed on Jun. 15, 2005, both of these being incorporated in the present application for reference. The solution consists in mixing features of different shape or in varying the orientation of a single feature on the surface of the plate. The features may be a mixture of various shapes but nevertheless all are in accordance with the invention. In particular, in addition to being in accordance with the present invention, the surface texture of the plate may consist of the assembly of individual features in relief, particularly pyramids, said individual features being based on one or more base features, but which are distinguished from each other by their depth, their height or the parameter of their base surface. FIG. 8 illustrates the shape that the juxtaposed pyramid bases may take so as to eliminate this reflection problem. This figure only shows the pyramid bases (having four faces), said bases being juxtaposed so that the lines of their bases form zigzag lines. Thanks to these different bases (rhombs at angles varying from one base to another), the reflection problem is eliminated. In addition to being in accordance with the present invention, the surface texture of the plate may also have a three-dimensional surface structure which comprises elements formed on the surface of the substrate and the extension of which is essentially longitudinal and is essentially greater than the extension of these elements in the transverse direction, the surface of the substrate forming overall groups of parallel elements, the orientation of the longitudinal extension of the elements of which alternates from one group to another. This is particularly the case of the structure shown in FIG. 6b) if this is combined with the fact that the curved prisms are according to the invention (FIG. 6c).

The textured plate according to the invention may form part of a wall, such as a vertical wall. This wall may contain photoelectric cells for collecting sunlight. Preferably, the plate is located on that side of the wall where the sun is predominant (higher light intensity). However, a plate according to the invention may be placed on both sides, each plate on each side then being equipped with a photovoltaic cell. The textured plate may therefore especially be used to improve the capture of sunlight in order to increase the luminous flux feeding the photoelectric cells. The plate may especially be made of glass (with a refractive index close to 1.5) and the photoelectric cell made of silicon (refractive index greater than 3). These photoelectric cells may be encapsulated in a resin of the polyvinyl butyral (PVB) or ethylene/vinyl acetate copolymer (EVA) type. This encapsulation may especially be carried out in a known manner in a hot pressurized autoclave (in which the resin melts), resulting in a sheet of resin in which the cells are trapped. The textured plate is then juxtaposed with this sheet in order to capture the light (with the texture on the ambient air side) and to deliver said light to the cells in the sheet. It is possible to combine all these components in a single autoclave step. It is generally sought to avoid the presence of air between the textured plate and the photovoltaic cell. To do this, it is general practice for resin (PVB or EVA) to be systematically placed between the textured plate and the cell. Such a complex structure may be used both for capturing solar energy and as a noise barrier. Its effectiveness as a noise barrier is even better when the resin used is of the "acoustic" type, that is to say one that attenuates noise.

The textured plate may have a thickness (reliefs included) of greater than 6 mm, or even greater than 8 mm, especially if it has to have greater mechanical strength. This is, for example, generally the case if the plate is incorporated into a noise barrier.

The table below compares the increases in light intensity (as a percentage) obtained in comparison with a textureless flat glass, in the case in which the plates are in a vertical position for annual exposure in Cologne in Germany, in the case of direct light and in the case of diffuse light. A plate was placed on each side of a vertical wall which could have a north-south (N/S) orientation in order to face the west in the case of one of the plates located on one side of the wall, and face the east in the case of the other plate located on the other side. The wall could also have an east-west (E/W) orientation in order to face south in the case of one of the plates located on one side of the wall and face north in the case of the other plate located on the other side. In all cases, the surface features had a pitch of around 2 to 3 mm.

| | | | | Direct light | | Diffuse light | |
|---|---|---|---|---|---|---|---|
| Ex. | Feature | $\alpha_1$ | $\alpha_2$ | N/S Wall | E/W Wall | N/S Wall | E/W Wall |
| 1 | Depressed pyramid | 90° | 45° | 15.5 | 12.8 | 21 | 22.9 |
| 2 (comp.) | Depressed pyramid | 45° | 45° | 12.2 | 8.9 | 16.2 | 17.7 |
| 3 | Projecting prism | 90° | 45° | 16.9 | 13.9 | 22.1 | 24.2 |
| 4 (comp.) | Projecting prism | 45° | 45° | 9.3 | 5.6 | 13.6 | 15.4 |

Examples 2 and 4 are comparative examples with symmetrical structures. The table shows that the invention provides an improvement in all situations, with comparable features (prisms or pyramids) in comparison with symmetrical features.

The invention claimed is:

1. An assembly comprising:
a plate made of a transparent material which is mineral glass or organic polymer, the plate including, on its surface, a texture including a plurality of a feature in relief, in a form of depressions or projections, the feature including a first face and a second face that are not mutually parallel, lines at a base of the faces being parallel, the first face forming, with a general plane of the plate, a larger angle than an angle formed by the second face with the general plane of the plate, the angle being an angle inside the material of the plate if the feature is a projection, of an angle on an outside of the material of the plate if the feature is a depression; and
a photovoltaic cell;
wherein the texture of the plate is located on an opposite side from the cell and the plate is configured to transmit light to the cell.

2. The assembly as claimed in claim 1, wherein the feature is a pyramid.

3. The assembly as claimed in claim 2, wherein the pyramid has a rhombic base.

4. The assembly as claimed in claim 1, wherein the feature is a prism.

5. The assembly as claimed in claim 1, wherein the lines parallel to the base of the faces are curved.

6. The assembly as claimed in claim 1, wherein the faces are smooth.

7. The assembly as claimed in claim 1, wherein the angle made by the first face with the general plane of the plate ranges from 50° to 130°.

8. The assembly as claimed in claim 7, wherein the angle made by the first face with the general plane of the plate ranges from 70° to 88°.

9. The assembly as claimed in claim 1, wherein the angle made by the second face with the general plane of the plate ranges from 10° to 60°.

10. The assembly as claimed in claim 9, wherein the angle made by the second face with the general plane of the plate ranges from 20° to 50°.

11. The assembly as claimed in claim 1, wherein the angle made by the first face with the general plane of the plate is greater than 90° and the angle made by the second face with the general plane of the plate is less than 45°.

12. The assembly as claimed in claim 1, wherein the plate includes a plurality of the features on the surface, with a pitch ranging from 0.1 to 10 mm.

13. The assembly as claimed in claim 1, wherein the feature includes a plurality of different shapes, or a same feature is oriented differently on the plate.

14. The assembly as claimed in claim 13, wherein the features are distinguished by their depth, their height, or a perimeter of their base surface.

15. The assembly as claimed in claim 1, wherein the features are predominantly oriented so that all directions orthogonal to the first faces of each feature are contained within a same quarter space facing the plate.

16. A method of capturing light, comprising positioning an assembly as claimed in claim 15, such that a direction of incident light rays lies within the quarter space.

17. The assembly as claimed in claim 1, wherein the photovoltaic cell is encapsulated in a resin.

18. A wall comprising an assembly of claim 1.

19. The wall as claimed in claim 18, wherein the wall is vertical.

20. A noise barrier comprising a wall of claim 18.

21. A plate of transparent material comprising:
on a surface of the plate, a texture including a plurality of a feature in relief, in a form of depressions or projections, the feature including a first face and a second face that are not mutually parallel, lines at a base of the faces being parallel, the first face forming, with a general plane of the plate, a larger angle than an angle formed by the second face with the general plane of the plate, the angle being an angle inside the material if the feature is a projection, or an angle on an outside of the material if the feature is a depression, the plate including a plurality of the features on the surface, with a pitch ranging from 0.1 to 10 mm.

22. The plate as claimed in claim 21, wherein the feature includes a plurality of different shapes, or a same feature is oriented differently on the plate.

23. The plate as claimed in claim 22, wherein the features are distinguished by their depth, their height, or a perimeter of their base surface.

24. A plate of transparent material comprising:
on a surface of the plate, a texture including a plurality of a feature in relief, in a form of depressions or projections, the feature including a first face and a second face that are not mutually parallel, lines at a base of the faces being parallel, the first face forming, with a general plane of the plate, a larger angle than an angle formed by the second face with the general plane of the plate, the angle being an angle inside the material if the feature is a projection, or an angle on an outside of the material if the feature is a depression, and the lines parallel to the base of the faces are curved.

25. The plate as claimed in claim 24, wherein the feature includes a plurality of different shapes, or a same feature is oriented differently on the plate.

26. The plate as claimed in claim 25, wherein the features are distinguished by their depth, their height, or a perimeter of their base surface.

\* \* \* \* \*

UNITED STATES PATENT AND TRADEMARK OFFICE
CERTIFICATE OF CORRECTION

PATENT NO. : 8,174,766 B2
APPLICATION NO. : 11/917438
DATED : May 8, 2012
INVENTOR(S) : Michele Schiavoni et al.

It is certified that error appears in the above-identified patent and that said Letters Patent is hereby corrected as shown below:

Column 8, line 30, delete "of" (first occurrence) and insert --or--,
      lines 42-43, delete "lines parallel to" and insert --parallel lines at--, and
      line 63, delete "features" and insert --feature--.
Column 9, line 27, delete "features" and insert --feature--.
Column 10, line 17, delete "lines parallel to" and insert --parallel lines at--.

Signed and Sealed this
Thirty-first Day of July, 2012

David J. Kappos
*Director of the United States Patent and Trademark Office*